United States Patent
Zheng et al.

(10) Patent No.: US 10,020,636 B2
(45) Date of Patent: Jul. 10, 2018

(54) TUNABLE LASER WITH MULTIPLE IN-LINE SECTIONS INCLUDING SAMPLED GRATINGS

(71) Applicant: Applied Optoelectronics, Inc., Sugar Land, TX (US)

(72) Inventors: Jun Zheng, Missouri City, TX (US); Klaus Alexander Anselm, Sugar Land, TX (US); Huanlin Zhang, Sugar Land, TX (US); Dion McIntosh-Dorsey, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 14/551,353

(22) Filed: Nov. 24, 2014

(65) Prior Publication Data
US 2015/0078751 A1    Mar. 19, 2015

Related U.S. Application Data

(63) Continuation-in-part of application No. 13/916,652, filed on Jun. 13, 2013.

(51) Int. Cl.
*H04B 10/50* (2013.01)
*H01S 5/06* (2006.01)
(Continued)

(52) U.S. Cl.
CPC ........ *H01S 5/1209* (2013.01); *H01S 5/06258* (2013.01); *H01S 5/02415* (2013.01);
(Continued)

(58) Field of Classification Search
CPC ....... H04B 10/503; H04B 10/27; H04J 14/02; H01S 5/06258; H01S 5/1209; H01S 5/02415; H01S 5/4087; H01S 5/1092
See application file for complete search history.

(56) References Cited

U.S. PATENT DOCUMENTS 4,896,325 A    1/1990   Coldren
5,413,884 A    5/1995   Koch et al.
(Continued)

OTHER PUBLICATIONS

Wang, Xu et al, "Uniform and Sampled Bragg Gratings in SOI Strip Waveguides with Sidewall Corrugations", Photonics IEEE Technology Letters, vol. 1, No. 1, Oct. 2010, pp. 1-3.
(Continued)

*Primary Examiner* — Shi K Li
*Assistant Examiner* — Mina Shalaby
(74) *Attorney, Agent, or Firm* — Grossman Tucker Perreault & Pfleger, PLLC; Norman S. Kinsella

(57) ABSTRACT

A tunable laser with multiple in-line sections including sampled gratings generally includes a semiconductor laser body with a plurality of in-line laser sections configured to be driven independently to generate laser light at a wavelength within a different respective wavelength range. Sampled gratings in the respective in-line sections have the same grating period and a different sampling period to produce the different wavelengths. The wavelength of the light generated in the respective laser sections may be tuned, in response to a temperature change, to a channel wavelength within the respective wavelength range. By selectively generating light in one or more of the laser sections, one or more channel wavelengths may be selected for lasing and transmission. By using sampled gratings with the same grating period in the multiple in-line sections, the multiple section tunable laser may be fabricated more easily.

22 Claims, 8 Drawing Sheets

(51) Int. Cl.
  *H04B 10/27* (2013.01)
  *H04J 14/02* (2006.01)
  *H01S 5/12* (2006.01)
  *H01S 5/0625* (2006.01)
  *H01S 5/024* (2006.01)
  *H01S 5/10* (2006.01)
  *H01S 5/40* (2006.01)

(52) U.S. Cl.
  CPC ........... *H01S 5/0612* (2013.01); *H01S 5/1092* (2013.01); *H01S 5/4087* (2013.01)

(56) References Cited

U.S. PATENT DOCUMENTS

| | | | |
|---|---|---|---|
| 5,536,085 A * | 7/1996 | Li | H01S 5/4031 |
| | | | 372/20 |
| 6,215,804 B1 | 4/2001 | Sahlen et al. | |
| 6,553,044 B1 | 4/2003 | Eden | |
| 6,608,855 B1 | 8/2003 | Hwang et al. | |
| 6,638,773 B1 * | 10/2003 | Hwang | H01S 5/1082 |
| | | | 438/2 |
| 6,707,967 B2 | 3/2004 | Rothenberg et al. | |
| 7,130,325 B2 | 10/2006 | Oh et al. | |
| 8,831,051 B2 | 9/2014 | Liu et al. | |
| 2005/0031009 A1 * | 2/2005 | Lee | H01S 5/12 |
| | | | 372/96 |
| 2007/0195849 A1 * | 8/2007 | Takagi | H01S 5/1228 |
| | | | 372/50.11 |
| 2008/0019693 A1 | 1/2008 | Sorin | |
| 2008/0037608 A1 * | 2/2008 | Zhou | G01N 21/4795 |
| | | | 372/50.11 |
| 2013/0084070 A1 | 4/2013 | Ho et al. | |
| 2013/0295703 A1 | 11/2013 | Shi et al. | |
| 2014/0341579 A1 * | 11/2014 | Effenberger | H04J 14/0221 |
| | | | 398/68 |
| 2015/0078751 A1 | 3/2015 | Zheng et al. | |

OTHER PUBLICATIONS

Zhang, Yi-mo et al, "Phase Mask Technique And Its Writing For Fiber Bragg Grating", Transactions of Tianjin University, vol. 7, No. 4, Dec. 2001, pp. 217-220.

Wang, H. et al, "Fabrication and Performance of an Index-Coupled DFB Laser with Sampled Grating", Semiconductor Science And Technology, 24, IOP Publishing Ltd. 2009, pp. 1-4.

Shi, Yuechun et al, "A Novel Concavely Apodized DFB Semiconductor Laser Using Common Holographic Exposure", Optical Society of America, vol. 21, No. 13, Jul. 2013, pp. 16022-16028.

Ryu, Sang-Wang and Kim, Jeha, "An Asymmetric Sampled Grating Laser and Its Application to Multi-Wavelength Laser Array", ETRI Journal, vol. 24, No. 5, Oct. 2002, pp. 341-348.

Mansuripur, Tobias S., et al, "Widely Tunable Mid-infrared Quantum Cascade Lasers Using Sampled Grating Reflectors", Optical Society of America, vol. 20, No. 21, Oct. 2012, pp. 23339-23348.

"Small Form Factor Transceiver Multisource Agreement—Cooperation Agreement for Small Form Factor Transceivers", Jan. 6, 1998, pp. 1-8.

"Small Form-Factor Pluggable (SFP) Transceiver MultiSource Agreement (MSA)—Cooperation Agreement For Small Form-Factor Pluggable Transceivers", Sep. 14, 2000, pp. 1-38.

US Office Action dated Mar. 15, 2016, received in U.S. Appl. No. 14/248,553, 16 pgs.

English language PCT International Search Report and Written Opinion dated Feb. 2, 2016, received in corresponding PCT Application No. PCT/US15/62377, 12 pgs.

* cited by examiner

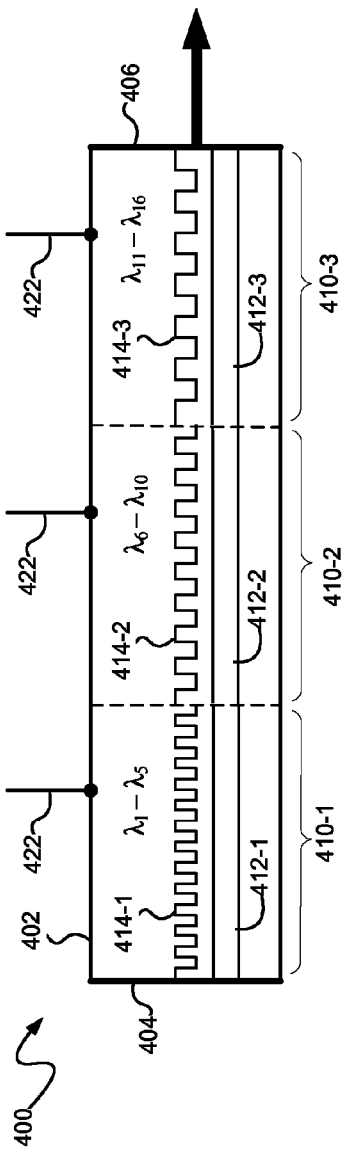
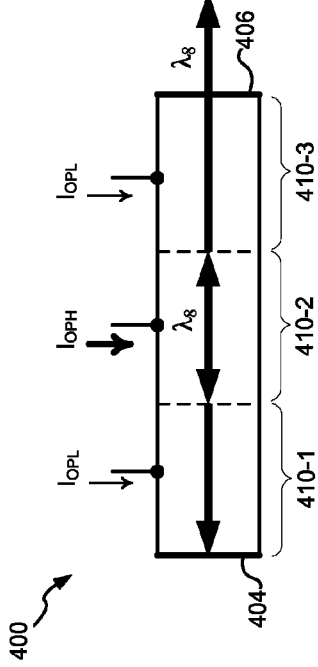
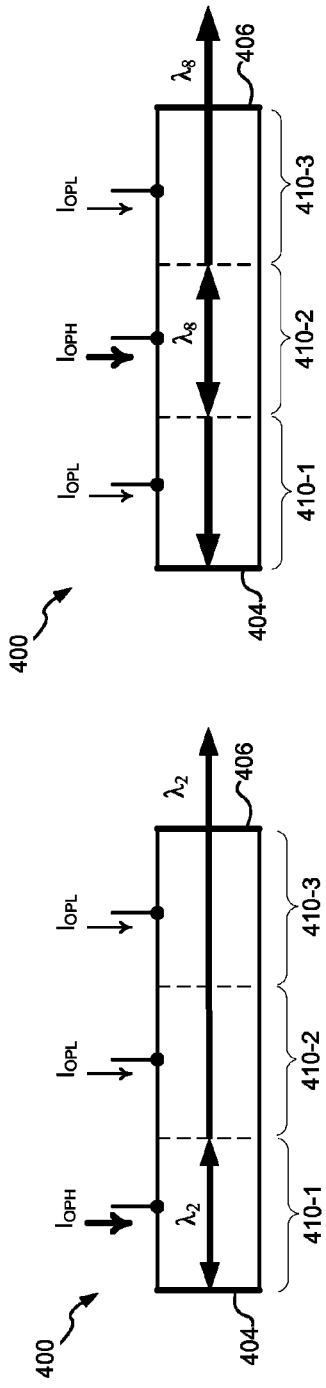

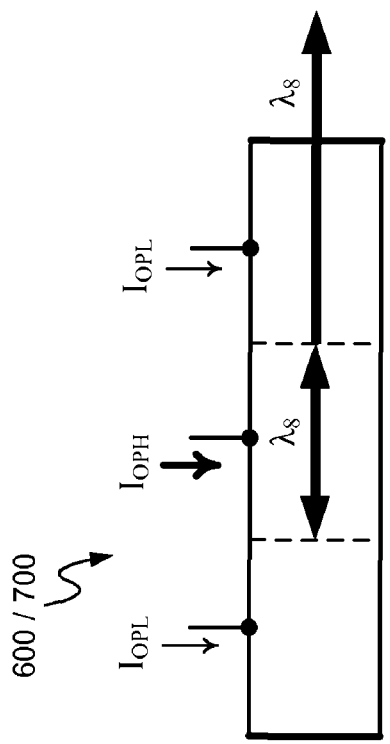
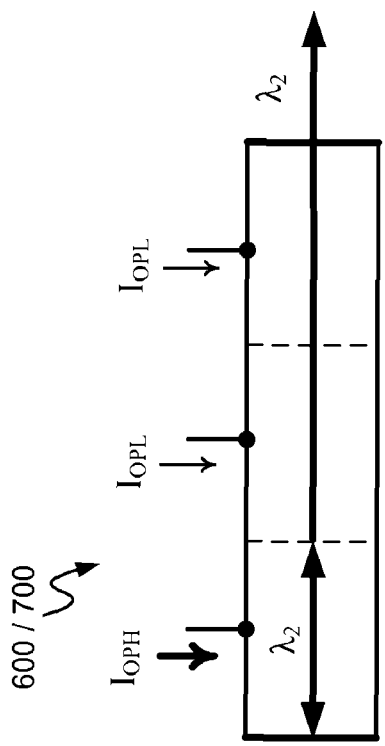
FIG. 8B
FIG. 8A

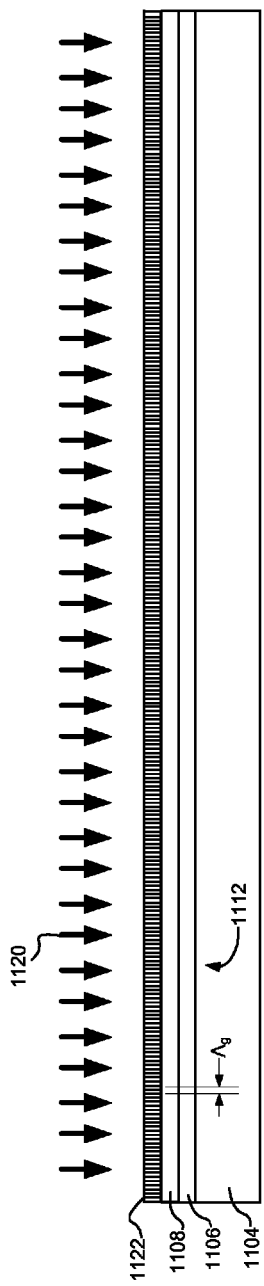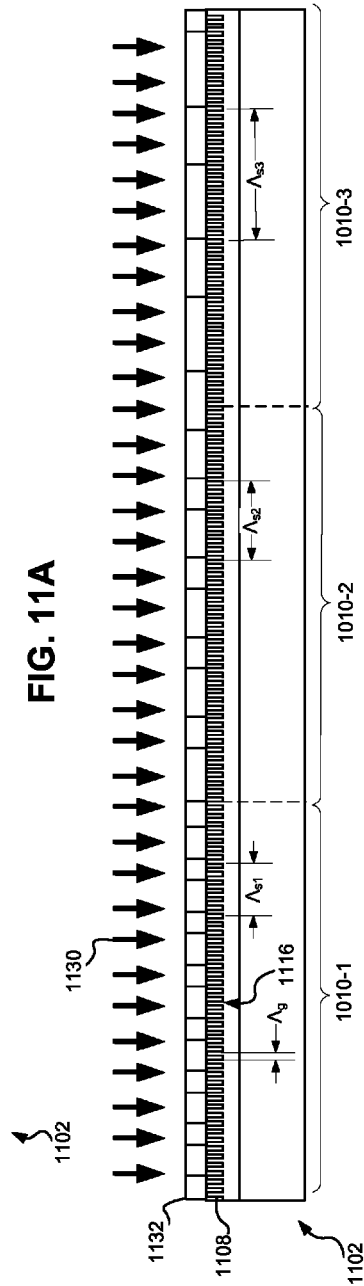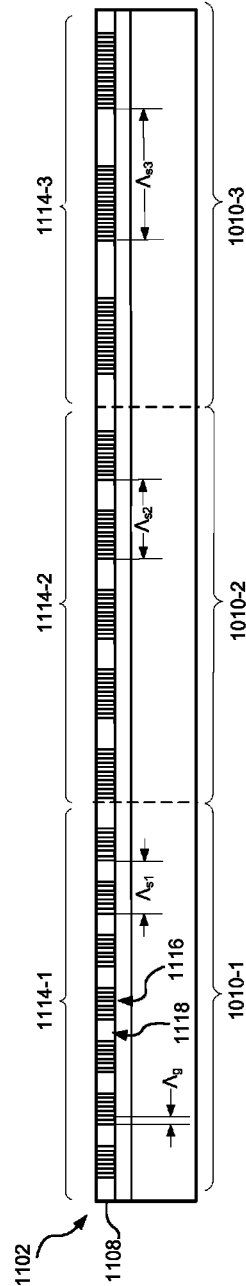

TUNABLE LASER WITH MULTIPLE IN-LINE SECTIONS INCLUDING SAMPLED GRATINGS

CROSS-REFERENCE TO RELATED APPLICATIONS

The present application is a continuation-in-part of U.S. patent application Ser. No. 13/916,652 filed on Jun. 13, 2013, which is fully incorporated herein by reference.

TECHNICAL FIELD

The present invention relates to tunable lasers and more particularly, to a tunable laser with multiple in-line sections including sampled gratings configured for tuning within multiple different ranges of channel wavelengths for use in tunable transmitters or transceivers in a wavelength division multiplexed (WDM) passive optical network (PON).

BACKGROUND INFORMATION

Optical communications networks, at one time, were generally "point to point" type networks including a transmitter and a receiver connected by an optical fiber. Such networks are relatively easy to construct but deploy many fibers to connect multiple users. As the number of subscribers connected to the network increases and the fiber count increases rapidly, deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. One challenge in developing such a PON is utilizing the capacity in the trunk fiber efficiently in order to transmit the maximum possible amount of information on the trunk fiber. Fiber optic communications networks may increase the amount of information carried on a single optical fiber by multiplexing different optical signals on different wavelengths using wavelength division multiplexing (WDM). In a WDM-PON, for example, the single trunk fiber carries optical signals at multiple channel wavelengths to and from the optical branching point and the branching point provides a simple routing function by directing signals of different wavelengths to and from individual subscribers. At each subscriber location, an optical networking terminal (ONT) or optical networking unit (ONU) is assigned one or more of the channel wavelengths for sending and/or receiving optical signals.

A challenge in a WDM-PON, however, is designing a network that will allow the same transmitter to be used in an ONT or ONU at any subscriber location. For ease of deployment and maintenance in a WDM-PON, it is desirable to have a "colorless" ONT/ONU whose wavelength can be changed or tuned such that a single device could be used in any ONT/ONU on the PON. With a "colorless" ONT/ONU, an operator only needs to have a single, universal transmitter or transceiver device that can be employed at any subscriber location.

One or more tunable lasers may be used to select different wavelengths for optical signals in a WDM system or network such as a WDM-PON. Various different types of tunable lasers have been developed over the years, but most were developed for high-capacity backbone connections to achieve high performance and at a relatively high cost. Many WDM-PON applications have lower data rates and shorter transmission distances as compared to high-capacity, long-haul WDM systems, and thus a lower performance and lower cost laser may suffice. The less expensive tunable lasers, however, often present challenges when used to cover a relatively wide range of channels (e.g., 16 channels) in a WDM-PON. In less expensive DFB lasers that are tuned by controlling the temperature, for example, the wavelength changes by only about 0.1 nm/° C. A temperature range of 120° C. would be needed to cover 16 channel wavelengths using such a laser.

BRIEF DESCRIPTION OF THE DRAWINGS

These and other features and advantages will be better understood by reading the following detailed description, taken together with the drawings wherein:

FIG. 4 is a schematic diagram of a multiple-section tunable laser with gratings in each of the laser sections, consistent with an embodiment of the present disclosure.

FIGS. 5A and 5B are schematic diagrams illustrating the operation of the multiple-section tunable laser shown in FIG. 4.

FIGS. 8A and 8B are schematic diagrams illustrating the operation of the multiple-section tunable lasers shown in FIGS. 6 and 7.

FIGS. 11A-11C are schematic diagrams illustrating an example of a method for making a multiple-section tunable laser with sampled gratings.

DETAILED DESCRIPTION

Figure 1:
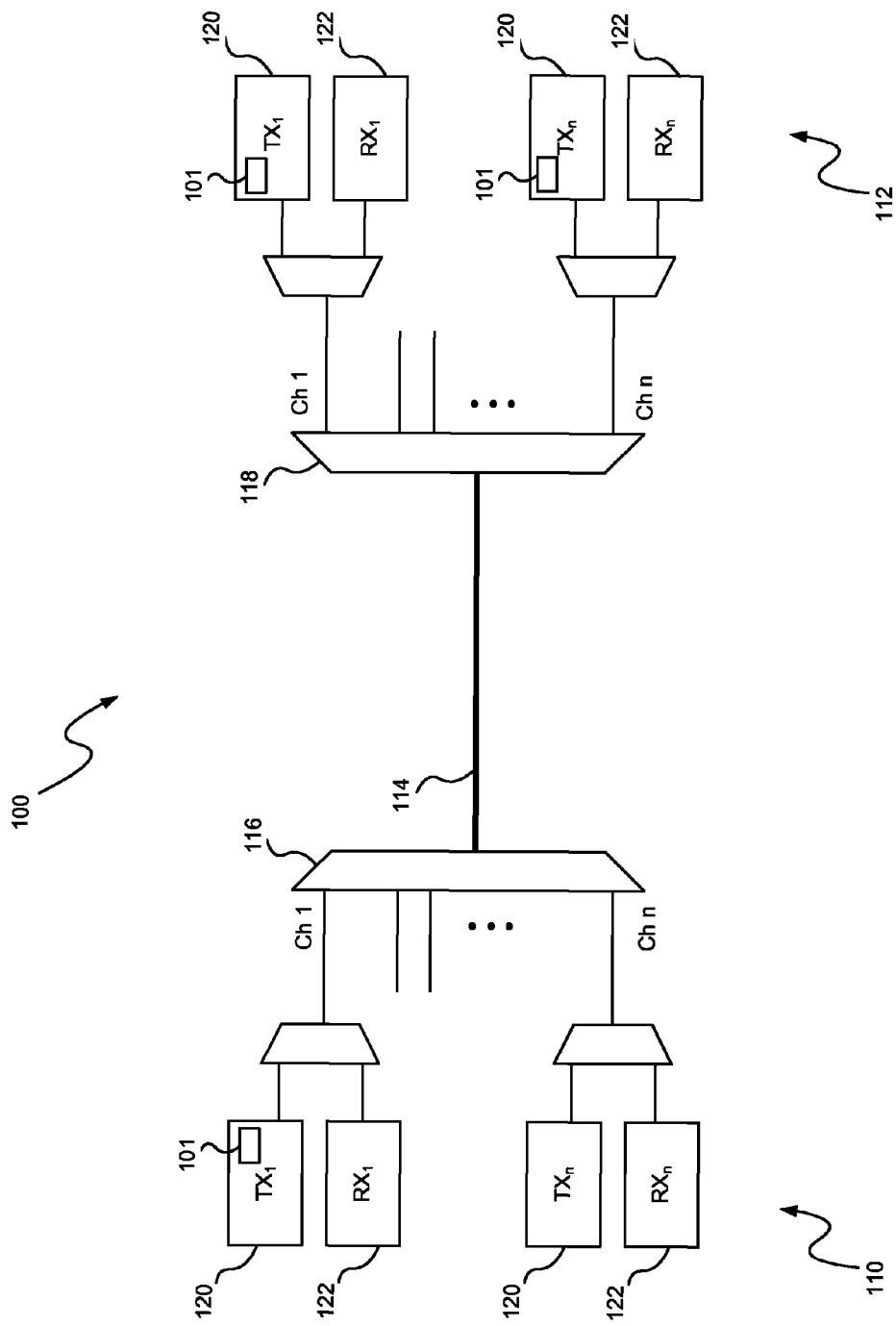
FIG. 1 is a schematic diagram of a wavelength division multiplexed (WDM) optical communication system including at least one multiple-section tunable laser, consistent with embodiments of the present disclosure.

A tunable laser with multiple in-line sections including sampled gratings, consistent with embodiments described herein, generally includes a semiconductor laser body with a plurality of in-line laser sections configured to be driven independently to generate laser light at wavelengths within different respective wavelength ranges. Sampled gratings in the respective in-line sections have the same grating period and a different sampling period to produce the different wavelengths. The wavelength of the light generated in the respective laser sections may be tuned, in response to a temperature change, to a channel wavelength within the respective wavelength range. By selectively generating light in one or more of the laser sections, one or more channel wavelengths may be selected for lasing and transmission. By using sampled gratings with the same grating period in the multiple in-line sections, the multiple section tunable laser may be fabricated more easily.

The tunable laser with multiple in-line sections including sampled gratings may be used, for example, in a tunable transmitter, to generate an optical signal at a selected channel wavelength and/or in a multiplexing optical transmitter to generate and combine optical signals at multiple different channel wavelengths. In one application, the tunable laser with multiple in-line sections may be used in optical transmitters or transceivers in a wavelength division multiplexed (WDM) optical system. A tunable laser with multiple in-line sections may be used, for example, in a tunable transmitter or transceiver in a WDM system such as an optical networking terminal (ONT) or optical networking unit (ONU) in a WDM passive optical network (PON) to select the appropriate transmission channel wavelength for the ONT/ONU. A tunable laser with multiple in-line sections may also be used, for example, in an optical line terminal (OLT) in a WDM-PON to provide multiple optical signals at different channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. As used herein, "in-line sections" refers to sections in the laser that are located along a line such that light from one section passes through another section and does not necessarily require the sections to be contiguous. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component.

Referring to FIG. 1, a WDM optical communication system 100 including one or more multiple-section tunable lasers 101, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $T_{X1}$ to $T_{Xn}$) and receivers 122 (e.g., $R_{X1}$ to $R_{Xn}$) associated with different channels (e.g., Ch. 1 to Ch. n) for transmitting and receiving optical signals at the different channel wavelengths between the one or more terminals 110, 112.

Each terminal 110, 112 may include one or more transmitters 120 and receivers 122, and the transmitters 120 and receivers 122 may be separate or integrated as a transceiver within a terminal. Optical multiplexers/demultiplexers 116, 118 at each end of the WDM system 100 combine and separate the optical signals at the different channel wavelengths. Aggregate WDM optical signals including the combined channel wavelengths are carried on the trunk optical path 114. One or more of the transmitters 120 may be a tunable transmitter capable of being tuned to the appropriate channel wavelength using a multiple-section tunable laser 101. Thus, the transmitters 120 may be constructed as universal, tunable transmitters capable of being used in different locations in the WDM system 100 and tuned to the appropriate channel wavelength depending upon the location in the WDM system 100.

Figure 2:
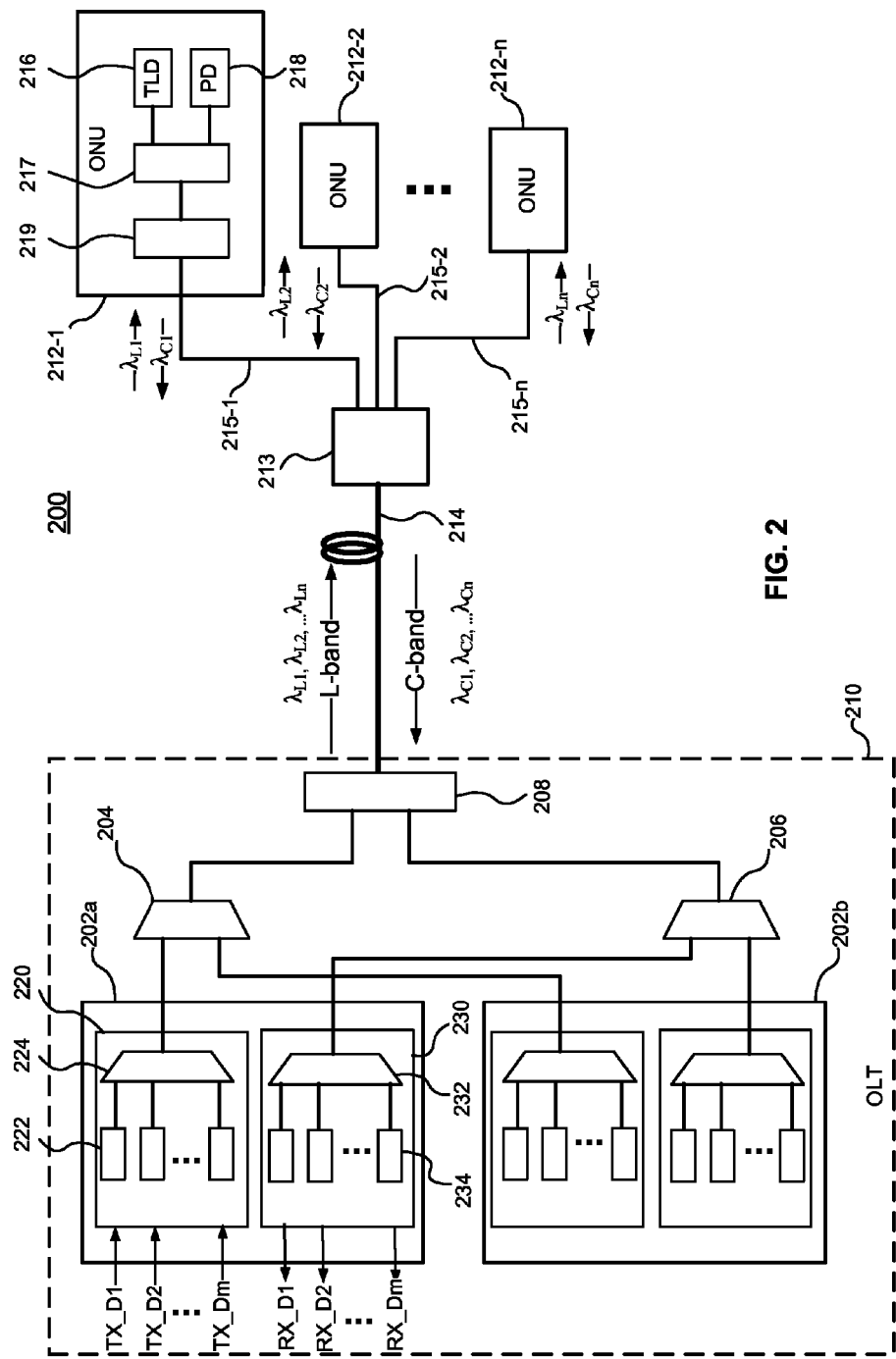
FIG. 2 is a schematic diagram of a wavelength division multiplexed (WDM) passive optical network (PON) including at least one multiple-section tunable laser, consistent with embodiments of the present disclosure.

Referring to FIG. 2, one or more multiple-section tunable lasers, consistent with embodiments of the present disclosure, may be used in transmitters and/or transceivers in a WDM-PON 200. The WDM-PON 200 provides a point-to-multipoint optical network architecture using a WDM system. According to one embodiment of the WDM-PON 200, at least one optical line terminal (OLT) 210 may be coupled to a plurality of optical networking terminals (ONTs) or optical networking units (ONUs) 212-1 to 212-n via optical fibers, waveguides, and/or paths 214, 215-1 to 215-n. The OLT 210 includes one or more multi-channel optical transceivers 102a, 102b. The multiple-section tunable lasers may be used in the ONTs/ONUs and/or in the OLT 210 to allow tuning to a channel wavelength, as described in greater detail below.

The OLT 210 may be located at a central office of the WDM-PON 200, and the ONUs 212-1 to 212-n may be located in homes, businesses or other types of subscriber location or premises. A branching point 213 (e.g., a remote node) couples a trunk optical path 214 to the separate optical paths 215-1 to 215-n to the ONUs 212-1 to 212-n at the respective subscriber locations. The branching point 213 may include one or more passive coupling devices such as a splitter or optical multiplexer/demultiplexer. In one example, the ONUs 212-1 to 212-n may be located about 20 km or less from the OLT 210.

The WDM-PON 200 may also include additional nodes or network devices, such as Ethernet PON (EPON) or Gigabit PON (GPON) nodes or devices, coupled between the branching point 213 and ONUs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 200, different ONUs 212-1 to 212-n may be assigned different channel wavelengths for transmitting and receiving optical signals. In one embodiment, the WDM-PON 200 may use different wavelength bands for transmission of downstream and upstream optical signals relative to the OLT 210 to avoid interference between the received signal and back reflected transmission signal on the same fiber. For example, the L-band (e.g., about 1565 to 1625 nm) may be used for downstream transmissions from the OLT 210 and the C-band (e.g., about 1530 to 1565 nm) may be used for upstream transmissions to the OLT 210. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 212-1 to 212-$n$ may thus be assigned different channel wavelengths within the L-band and within the C-band. Transceivers or receivers located within the ONUs 212-1 to 212-$n$ may be configured to receive an optical signal on at least one channel wavelength in the L-band (e.g., $\lambda_{L1}, \lambda_{L2}, \ldots \lambda_{Ln}$). Transceivers or transmitters located within the ONUs 212-1 to 212-$n$ may be configured to transmit an optical signal on at least one channel wavelength in the C-band (e.g., $\lambda_{C1}, \lambda_{C2}, \ldots \lambda_{Cn}$). Other wavelengths and wavelength bands are also within the scope of the system and method described herein.

The branching point 213 may demultiplex a downstream WDM optical signal (e.g., $\lambda_{L1}, \lambda_{L2}, \ldots \lambda_{Ln}$) from the OLT 210 for transmission of the separate channel wavelengths to the respective ONUs 212-1 to 212-$n$. Alternatively, the branching point 213 may provide the downstream WDM optical signal to each of the ONUs 212-1 to 212-$n$ and each of the ONUs 212-1 to 212-$n$ separates and processes the assigned optical channel wavelength. The individual optical signals may be encrypted to prevent eavesdropping on optical channels not assigned to a particular ONU. The branching point 213 also combines or multiplexes the upstream optical signals from the respective ONUs 212-1 to 212-$n$ for transmission as an upstream WDM optical signal (e.g., $\lambda_{C1}, \lambda_{C2}, \ldots \lambda_{Cn}$) over the trunk optical path 214 to the OLT 210.

One embodiment of the ONU 212-1 includes a laser 216 for transmitting an optical signal at the assigned upstream channel wavelength ($\lambda_{C1}$) and a photodetector 218, such as a photodiode, for receiving an optical signal at the assigned downstream channel wavelength ($\lambda_{L1}$). The laser 216 may include a multiple-section tunable laser, consistent with embodiments described herein, configured to be tuned to the assigned channel wavelength, for example, by changing a temperature of the laser 216. This embodiment of the ONU 212-1 may also include a diplexer 217 coupled to the laser 216 and the photodetector 218 and a C+L band filter 219 coupled to the diplexer 217, which allow the L-band channel wavelength ($\lambda_{L1}$) to be received by the ONU 212-1 and the C-band channel wavelength ($\lambda_{C1}$) to be transmitted by the ONU 212-1. The ONU 212-1 may also include a temperature control system for controlling a temperature of the laser 216 and laser driver circuitry for driving the laser 216.

The OLT 210 may be configured to generate multiple optical signals at different channel wavelengths (e.g., $\lambda_{L1}, \lambda_{L2}, \ldots \lambda_{Ln}$) and to combine the optical signals into the downstream WDM optical signal carried on the trunk optical fiber or path 214. Each of the OLT multi-channel optical transceivers 202a, 202b may include a multi-channel transmitter optical subassembly (TOSA) 220 for generating and combining the optical signals at the multiple channel wavelengths. The OLT 210 may also be configured to separate optical signals at different channel wavelengths (e.g., $\lambda_{C1}, \lambda_{C2}, \ldots \lambda_{Cn}$) from an upstream WDM optical signal carried on the trunk path 214 and to receive the separated optical signals. Each of the OLT multi-channel optical transceivers 202a, 202b may thus include a multi-channel receiver optical subassembly (ROSA) 230 for separating and receiving the optical signals at multiple channel wavelengths.

One embodiment of the multi-channel TOSA 220 includes an array of lasers 222, which may be modulated by respective RF data signals (TX_D1 to TX_Dm) to generate the respective optical signals. The lasers 222 may include multiple-section tunable lasers as described herein. The lasers 222 may be modulated using various modulation techniques including external modulation and direct modulation. An optical multiplexer 224, such as an arrayed waveguide grating (AWG), combines the optical signals at the different respective downstream channel wavelengths (e.g., $\lambda_{L1}, \lambda_{L2}, \ldots \lambda_{Lm}$). The lasers 222 may be tuned to the channel wavelengths by changing a temperature of the lasers 222. The TOSA 220 may also include a temperature control system for controlling temperature of the lasers 222 and the multiplexer 224 to maintain a desired wavelength precision or accuracy.

In the illustrated embodiment, the OLT 210 further includes a multiplexer 204 for multiplexing the multiplexed optical signal from the multi-channel TOSA 220 in the multi-channel transceiver 202a with a multiplexed optical signal from a multi-channel TOSA in the other multi-channel transceiver 202b to produce the downstream aggregate WDM optical signal.

One embodiment of the multi-channel ROSA 230 includes a demultiplexer 232 for separating the respective upstream channel wavelengths (e.g., $\lambda_{C1}, \lambda_{C2}, \ldots \lambda_{Cn}$). An array of photodetectors 234, such as photodiodes, detects the optical signals at the respective separated upstream channel wavelengths and provides the received data signals (RX_D1 to RX_Dm). In the illustrated embodiment, the OLT 210 further includes a demultiplexer 206 for demultiplexing the upstream WDM optical signal into first and second WDM optical signals provided to the respective multi-channel ROSA in each of the transceivers 202a, 202b. The OLT 210 also includes a diplexer 208 between the trunk path 214 and the multiplexer 204 and the demultiplexer 206 such that the trunk path 214 carries both the upstream and the downstream channel wavelengths. The transceivers 202a, 202b may also include other components, such as laser drivers, transimpedance amplifiers (TIAs), and control interfaces, used for transmitting and receiving optical signals.

In one example, each of the multi-channel optical transceivers 202a, 202b may be configured to transmit and receive 16 channels such that the WDM-PON 200 supports 32 downstream L-band channel wavelengths and 32 upstream C-band channel wavelengths. One example of the WDM-PON 200 may operate at 1.25 Gbaud using on-off keying as the modulation scheme. Other data rates and modulation schemes may also be used.

As mentioned above, the upstream and downstream channel wavelengths may span a range of channel wavelengths on the 100 GHz ITU grid. Each of the transceivers 202a, 202b, for example, may cover 16 channel wavelengths in the L-band for the TOSA and 16 channel wavelengths in the C-band for the ROSA such that the transceivers 202a, 202b together cover 32 channels. Thus, the multiplexer 204 may combine 16 channels from one transceiver 202a with 16 channels from the other transceiver 202b, and the demultiplexer 206 may separate a 32 channel WDM optical signal into two 16 channel WDM optical signals. To facilitate use of the multiplexer 204 and the demultiplexer 206, the range of channel wavelengths may skip channels in the middle of the range. According to one example of a multi-channel optical transceiver used in the WDM-PON 200, the desired wavelength precision or accuracy is ±0.05 nm, and the desired operating temperature is between −5 and 70° C.

Figure 3:
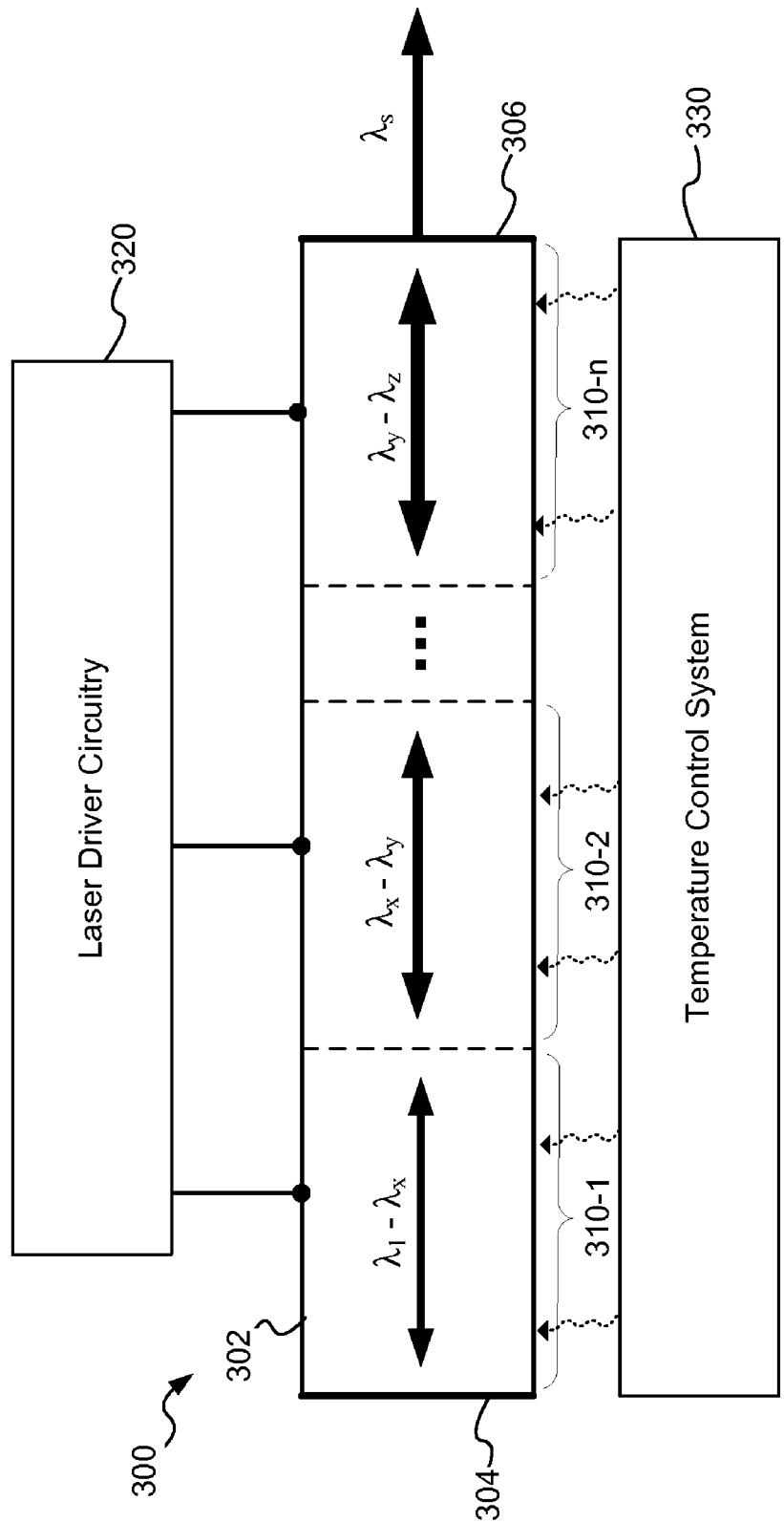
FIG. 3 is a schematic diagram of a multiple-section tunable laser, consistent with embodiments of the present disclosure.

Referring to FIG. 3, a multiple-section tunable laser 300 capable of being used in a WDM system, such as a WDM-PON, is described in greater detail. The multiple-section tunable laser 300 includes a semiconductor laser body 302 extending between a back facet 304 and a front facet 306. The laser body 302 includes a plurality of in-line thermally tunable laser sections 310-1 to 310-$n$ arranged "in line" from the back facet 304 to the front facet 306. As will be described in greater detail below, each of the in-line laser sections 310-1 to 310-$n$ may be configured to generate laser light within a different respective wavelength range, for example, by using different cavity lengths and/or grating structures. Each of the in-line laser sections 310-1 to 310-$n$ may be contiguous with one or more adjacent in-line laser sections such that the laser body 302 is formed as a single piece. In other words, the in-line laser sections 310-1 to 310-$n$ may be fabricated together on the same chip.

Although the illustrated embodiment shows the laser sections 310-1 to 310-$n$ having approximately the same length, one or more of the laser sections 310-1 to 310-$n$ may have different lengths. Although the illustrated embodiments show three (3) laser sections, a multiple-section tunable laser may include other numbers of in-line laser sections.

Each of the in-line laser sections 310-1 to 310-$n$ may be thermally tuned such that laser light is emitted from the front facet 306 of the laser body 302 at a selected wavelength $\lambda_s$, such as a selected channel wavelength, within one of the respective wavelength ranges. The laser light emitted from the tunable laser 300 may be predominantly at the selected wavelength $\lambda_s$ and light at wavelengths other than the selected channel may be minimized to improve performance (e.g., reduce noise). The laser light emitted from the tunable laser 300 may also be filtered to remove a substantial portion or all of the wavelengths other than the selected wavelength.

Laser driver circuitry 320 is electrically connected to each of the laser sections 310-1 to 310-$n$ for driving each of the laser sections 310-1 to 310-$n$ independently to generate laser light from a selected one of the laser sections 310-1 to 310-$n$ and within the respective wavelength range. The laser driver circuitry 320 may include circuitry configured to drive semiconductor lasers by applying a driving or operating current ($I_{op}$) sufficient to induce lasing. In an optical transmitter, for example, the laser driver circuitry 320 modulates the respective one of the laser sections 310-1 to 310-$n$ with an electrical signal, such as an RF signal, to produce a modulated optical signal at a selected channel wavelength.

The selected one of the laser sections 310-1 to 310-$n$ (i.e. the laser section with a wavelength range including a selected channel wavelength) may be driven by a higher driving current above a threshold current (e.g., 12 mA) sufficient to cause lasing in that selected or active laser section. One or more of the other ones of the laser sections 310-1 to 310-$n$ may be turned off or driven at a lower driving current below the threshold current that causes lasing. For example, the laser section(s) between the active laser section and the back facet 404 may be turned off. The laser sections between the active laser section and the front facet 306 may be driven at the lower driving current to be made sufficiently transparent to reduce loss, but without lasing, when the laser light from the active laser section passes through.

A temperature control system 330 is thermally coupled to each of the laser sections 310-1 to 310-$n$ for thermally tuning each of the laser sections 310-1 to 310-$n$ to a selected wavelength within the respective wavelength range. The laser sections 310-1 to 310-$n$ may be thermally tuned using any configuration or technique capable of tuning to a selected wavelength in response to temperature changes. The temperature control system 330 may include one or more temperature control devices, such as thermoelectric coolers (TECs) and/or resistive heaters, for changing a temperature of each laser section sufficient to change the wavelength generated within that laser section. The temperature of each of the laser sections 310-1 to 310-$n$ may be changed using the same temperature control device or using individual temperature control devices thermally coupled to the respective laser sections 310-1 to 310-$n$. The temperature control system 330 may also include temperature sensors and/or wavelength monitors and control circuitry. The control circuitry may cause the temperature control devices to set the temperature, for example, in response to a monitored temperature at the tunable laser 300 or in response to a monitored wavelength emitted by the tunable laser 300.

As illustrated, for example, the laser section 310-1 may be driven and tuned to generate laser light at a channel wavelength within the wavelength range $\lambda_1$-$\lambda_x$, the laser section 310-2 may be driven and tuned to generate laser light at a channel wavelength within the wavelength range $\lambda_x$-$\lambda_y$, and the laser section 310-$n$ may be driven and tuned to generate laser light at a channel wavelength within the wavelength range $\lambda_y$-$\lambda_z$. Thus, the multiple-section tunable laser 300 may be used to generate and emit a selected channel wavelength $\lambda_s$ from z channel wavelengths by driving and thermally tuning one of the sections 310-1 to 310-$n$. By using the multiple in-line thermally tunable laser sections 310-1 to 310-$n$ with different respective wavelength ranges, the tunable laser 300 is capable of being tuned to a wider range of channel wavelengths within a smaller temperature range.

In one example with sixteen (16) channels, the multiple section tunable laser 300 may include three (3) in-line laser sections and each respective wavelength range may cover about 4 nm and may include at least five (5) channel wavelengths. Although the wavelength shift with temperature is generally a function of the material properties, in one example, the wavelength in each of the laser sections may change by about 0.1 nm/° C. Thus, each laser section should be tunable to about 5 or 6 different channel wavelengths in different respective wavelength ranges in the C-band using the same temperature range of about $\Delta 40°$ C.

One embodiment of a multiple section tunable laser 400, shown in FIG. 4, uses different grating structures to generate laser light in different respective wavelengths, for example, similar to a distributed feedback (DFB) laser. The multiple section tunable laser 400 includes a semiconductor laser body 402 with a plurality of in-line thermally tunable laser sections 410-1 to 410-3 including respective grating sections 414-1 to 414-3 along semiconductor active regions 412-1 to 412-3. The semiconductor active regions 412-1 to 412-3 may include a multiple quantum-well active region or other gain media capable of emitting a spectrum of light across a range of wavelengths and capable of amplifying light reflected back into the gain media. The grating sections 414-1 to 414-3 have grating structures (e.g., grating period, index of refraction, and length) that generate light within the respective wavelength ranges. The grating sections 414-1 to 414-3 may include, for example, diffraction or Bragg grating structures known for use in DFB lasers for distributively feeding light back by Bragg reflection at a Bragg wavelength.

As illustrated, each of the grating sections 414-1 to 414-3 may have a different structure (e.g., different grating period) corresponding to the different respective wavelength ranges. In the illustrated example, the first grating section 414-1 in the first laser section 410-1 is configured to reflect light at a Bragg wavelength in a wavelength range of $\lambda_1$-$\lambda_5$, the second grating section 414-2 in the second laser section 410-2 is configured to reflect light at a Bragg wavelength in a wavelength range of $\lambda_6$-$\lambda_{10}$, and the third grating section 414-3 in the third laser section 410-3 is configured to reflect light at a Bragg wavelength in a wavelength range of $\lambda_{11}$-$\lambda_{16}$. The laser sections 410-1 to 410-3 may be thermally tuned to change the reflected Bragg wavelength within the respective wavelength ranges and select the lasing wavelength.

Although lasing occurs within each of the laser sections 410-1 to 410-3 as a result of the reflections and feedback within the grating sections 414-1 to 414-3, the laser light may pass out of the laser sections 410-1 to 410-3 and the effective laser cavity may be longer than the laser section that is active. Because reflection is not required by the front facet 406 for lasing, the front facet 406 may include an anti-reflective (AR) coating, for example, with a reflectivity of less than about 1% reflective. The laser light generated in a selected one of the laser sections 410-1 to 410-3 may thus be emitted from the front facet 406. When there is sufficient reflectivity in the laser sections, the back facet 404 may also include an anti-reflective (AR) coating. In other embodiments, the back facet 404 may include a highly reflective (HR) coating having a reflectivity of at least about 80% to reflect most of the laser light to the front facet 406. In either case, the back facet 404 may allow a portion of the laser light to pass through the back facet 404 for monitoring. In other embodiments, when the first laser section 410-1 and/or second laser section 410-2 are not active or turned off, the light passing through the back facet 404 may be insufficient for monitoring purposes.

Operation of an embodiment of the multiple section laser 400 is illustrated in greater detail in FIGS. 5A and 5B. To select a channel wavelength $\lambda_2$ in the first wavelength range $\lambda_1$-$\lambda_5$ (FIG. 5A) in this example, the higher driving current ($I_{OPH}$) is applied to the first laser section 410-1 and the lower driving current ($I_{OPL}$) is applied to the other laser sections 410-2, 410-3. As the first laser section 410-1 is driven, the temperature of the first laser section 410-1 is set such that the first laser section 410-1 is thermally tuned to the selected channel wavelength $\lambda_2$. The light generated in the first laser section 410-1 is reflected by the first grating section 414-1 and within the first laser section 410-1 until lasing occurs. The laser light at the selected channel wavelength $\lambda_2$ then passes out of the first laser section 410-1 and is emitted from the front facet 406. By driving the other sections 410-2, 410-3 at the lower driving current ($I_{OPL}$), loss may be reduced as the laser light at the selected channel wavelength $\lambda_2$ passes through these sections. To select another channel wavelength in the first wavelength range $\lambda_1$-$\lambda_5$, the tunable laser 400 may be further tuned by changing the temperature.

To select a channel wavelength $\lambda_8$ in the second wavelength range $\lambda_6$-$\lambda_{10}$ (FIG. 5B), the higher driving current ($I_{OPH}$) is applied to the second laser section 410-2 and the lower driving current ($I_{OPL}$) is applied to the other laser sections 410-1, 410-3. Alternatively, the laser section 410-1 between the active laser section 410-2 and the back facet 404 may be turned off. As the second laser section 410-2 is driven, the temperature of the second laser section 410-2 is set such that the second laser section 410-2 is thermally tuned to the selected channel wavelength $\lambda_8$. The light generated in the second laser section 410-2 is reflected by the second grating section 414-2 and within the second laser section 410-2 until lasing occurs. The laser light at the selected channel wavelength $\lambda_8$ then passes out of the second laser section 410-2 and is emitted from the front facet 406. By driving the other sections 410-1, 410-3 at the lower driving current ($I_{OPL}$), loss can be reduced as the laser light at the selected channel wavelength $\lambda_8$ passes through these sections. To select another channel wavelength in the second wavelength range $\lambda_6$-$\lambda_{10}$, the tunable laser 400 may be further tuned by changing the temperature. Channel wavelengths in the third wavelength range $\lambda_{11}$-$\lambda_{16}$ may also be selected by similarly driving and thermally tuning the third laser section 410-3.

As illustrated in FIGS. 5A and 5B, the lasing may occur at the selected wavelengths within the lasing sections that are driven and active, but the laser cavity may effectively extend between back facet 404 and the front facet 406 because the light passes out of both ends of the lasing sections. Thus, the reflections from the gratings in the non-active sections may influence the laser performance.

In one embodiment, the laser sections 410-1 to 410-3 in the multiple-section tunable laser 400 may have different lengths. One skilled in the art may determine the lengths for tuning the performance (e.g., efficiency and threshold current) of each of the different laser sections 410-1 to 410-3. Providing different lengths of the laser sections 310-1 to 310-n may also reduce the influence of back reflections from non-active sections (e.g., the second and third sections 410-2, 410-3 shown in FIG. 5A) on the mode stability of the multiple-section tunable laser 400. In one example, the first laser section 410-1 may have a length of 300 microns, the second laser section 410-2 may have a length of 400 microns, and the third laser section 410-3 may have a length of 500 microns.

Although the embodiment of the multiple section tunable laser 400 shown in FIG. 4 may advantageously extend the wavelength tuning range without extending the temperature range, the grating sections 414-1 to 414-3, similar to gratings in DFB type lasers, may produce degenerate modes. The existence of these degenerate modes may result in multi-mode operation, unpredictable modes, or mode hopping, sometimes referred to as mode degeneracy.

Figure 6A:
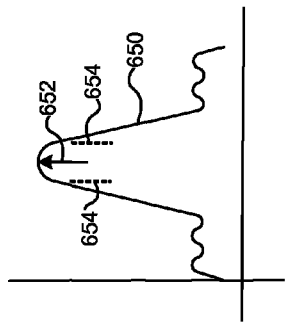
FIG. 6A is a graph illustrating a wavelength spectrum and lasing point associated with a section in the multiple-section tunable laser shown in FIG. 6.
Figure 7A:
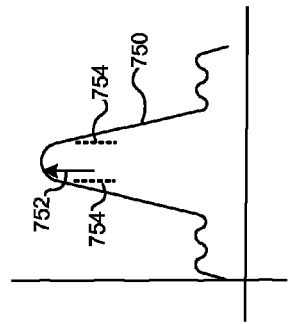
FIG. 7A is a graph illustrating a wavelength spectrum and lasing point associated with a section in the multiple-section tunable laser shown in FIG. 7.
Figure 6:
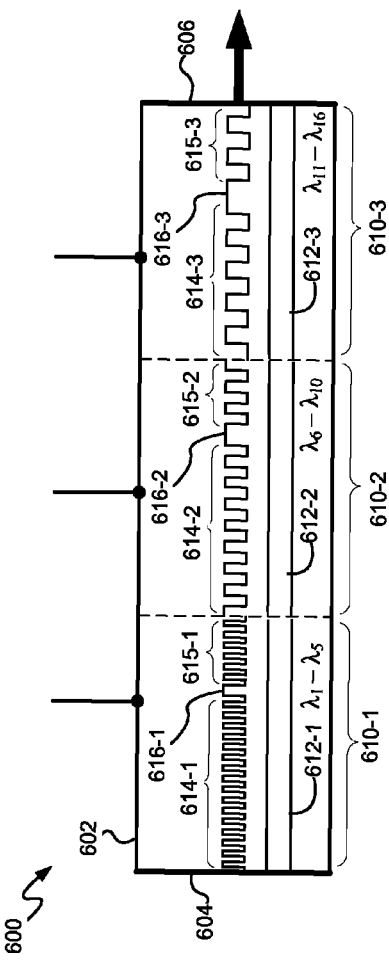
FIG. 6 is a schematic diagram of a multiple-section tunable laser with gratings and a phase shift in each of the laser sections, consistent with an embodiment of the present disclosure.
Figure 7:
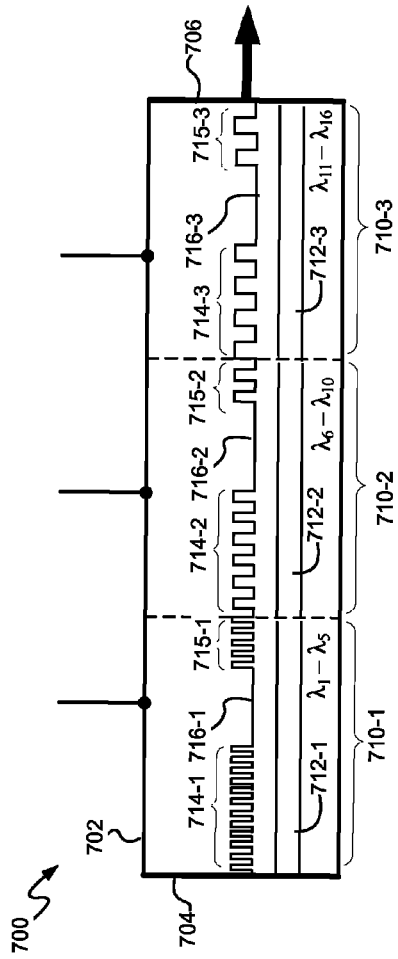
FIG. 7 is a schematic diagram of a multiple-section tunable laser with gratings and a phase shift in each of the laser sections, consistent with another embodiment of the present disclosure.

Other embodiments of multiple section tunable lasers 600, 700, shown in FIGS. 6 and 7, use different grating structures that provide a phase shift of the laser light to suppress mode degeneracy and provide a single mode operation at a selected wavelength. In one embodiment, the phase shift is approximately a π/2 optical phase shift of the laser light at the Bragg wavelength ($\lambda_B$) of the grating section, which is also referred to as a quarter-wavelength or λ/4 phase shift because a π/2 phase shift at the Bragg wavelength $\lambda_B$ is equivalent to adding a section of $\Lambda/2 = \lambda_B/(4n_e)$ into the grating structure where $\Lambda$ is the period of the grating and $n_e$ is the effective refractive index of the waveguide having the grating. As used herein, a "λ/4 phase shift" refers to an optical shift of the laser light in phase by about π/2 or by an equivalent amount that suppresses mode degeneracy sufficiently to provide single-mode operation at or near the Bragg wavelength. The term "λ/4 phase shift" does not necessarily require a phase shift that exactly corresponds to λ/4 or π/2, single-mode operation at exactly the Bragg wavelength, or a change in the phase of the grating itself. The term "λ/4 phase shift" also does not require a single λ/4 phase shift but may include multiple smaller, distributed phase shifts (e.g., two λ/8 phase shifts), which are equivalent to a λ/4 phase shift. Although example embodiments refer to a λ/4 phase shift, other embodiments of a multiple section tunable laser may provide other phase shifts capable of providing single mode operation.

The multiple section tunable laser 600 shown in FIG. 6 provides a λ/4 phase shift by including a π/2 phase shift section in the grating. The multiple section tunable laser 600 includes a laser body 602 with multiple laser sections 610-1 to 610-3 extending "in line" between a back facet 604 and a front facet 606. The laser sections 610-1 to 610-3 include back grating sections 614-1 to 614-3 and front grating sections 615-1 to 615-3 along semiconductor active regions 612-1 to 612-3. Phase shift sections 616-1 to 616-2 between the back grating sections 614-1 to 614-3 and the front grating sections 615-1 to 615-3 provide a π/2 grating shift by flipping the grating 180° at one point (i.e., adding a section of Λ/2), which introduces the λ/4 phase shift in the laser light reflected between the grating sections.

In addition to flipping the grating by 180° at the phase shift sections 616-1 to 616-3, the back grating sections 614-1 to 614-3 and the front grating sections 615-1 to 615-3 may also be separated by blank sections without gratings. Separating the back grating sections 614-1 to 614-3 from the front grating sections 615-1 with the phase shift sections 616-1 to 616-3 may create a DBR mirror like function such that the lasing cavity is within each laser section that is lasing. In the illustrated embodiment, the back grating sections 614-1 to 614-3 are longer than the front grating sections 615-1 to 615-3, thereby providing higher reflectivity at the back of each of the laser sections. One skilled in the art may select the length of the back grating sections 614-1 to 614-3 relative to the front grating sections 615-1 to 615-3 as a tradeoff between efficiency and mode stability. In this embodiment, both the back facet 604 and the front facet 606 may have AR coatings.

The grating coupling strengths of the grating sections in the multiple section tunable laser 600 may be in a range of 1-4 and more specifically in a range of 2-3. As used herein, "grating coupling strength" is a unitless value generally described as the coupling parameter κ (usually measured in inverse centimeters—cm$^{-1}$) times the length l. In some embodiments, each of the different grating sections (e.g., 614-1, 615-1, 614-2, 615-2, 614-3, 615-3) may also have different coupling strengths to improve performance.

As illustrated by the wavelength spectrum 650 in FIG. 6A, highest reflectivity occurs at the Bragg wavelength at the peak but lasing may occur at one or both of the degenerate lasing modes indicated by dashed lines 654 unless the degenerate modes are suppressed by introducing the λ/4 phase shift. By providing the λ/4 phase shift in each of the laser sections 610-1 to 610-3, the multiple section tunable laser 600 suppresses the degenerate lasing modes 654 and locks on to a single lasing wavelength as indicated by arrow 652 at the Bragg wavelength, thereby providing single-mode operation. As discussed above, the Bragg wavelength (and thus the lasing wavelength 652) for each of the laser sections 610-1 to 610-3 changes with temperature changes.

Although the embodiment of the multiple section tunable laser 600 shown in FIG. 6 may provide single-mode operation within each of the multiple in-line laser sections, fabrication of the phase shift within the grating itself requires two separate gratings in each section and may present manufacturing difficulties. The multiple section tunable laser 700 shown in FIG. 7 provides a λ/4 phase shift in the laser light by providing a section where there is no grating (i.e., a gratingless section) but without any change in the phase of the grating structure. The multiple section tunable laser 700 includes a laser body 702 with multiple laser sections 710-1 to 710-3 extending "in line" between a back facet 704 and a front facet 706. The laser sections 710-1 to 710-3 include back grating sections 714-1 to 714-3, gratingless sections 716-1 to 716-3, and front grating sections 715-1 to 715-3 along semiconductor active regions 712-1 to 712-3.

The gratings of the back grating sections 714-1 to 714-3 and the front grating sections 715-1 to 715-3 may be "in phase" with each other and the gratingless sections 716-1 to 716-3 cover a length between the back and front grating sections, which are missing grating periods that otherwise would be in phase with the grating periods of the back and front grating sections. Thus, the gratingless sections 716-1 to 716-3 have different effective indices of refraction than the grating sections and effectively provide distributed phase shift sections because they extend over a substantial number of missing grating periods between the back grating sections 714-1 to 714-3 and the front grating sections 715-1 to 715-3. The gratingless sections 716-1 to 716-3 may thus provide the λ/4 phase shift without requiring a change in the actual grating phase between the back grating sections 714-1 to 714-3 and the front grating sections 716-1 to 716-3 and without requiring the back and front grating sections to be formed separately with different grating periods.

The gratingless sections 716-1 to 716-3 may be formed by first forming a continuous, uniform grating having the desired grating period and then removing a portion of the gratings (e.g., by chemically etching) between the back grating sections 714-1 to 714-3 and the front grating sections 715-1 to 715-3. Examples of gratingless structures providing a λ/4 phase shift and methods of forming such gratingless structures are described in greater detail in U.S. Pat. Nos. 6,608,855 and 6,638,773, which are incorporated herein by reference.

In this embodiment, the back grating sections 714-1 to 714-3 are longer than the front grating sections 715-1 to 715-3 and the gratingless sections 716-1 to 716-3 are shorter than the back grating sections 714-1 to 714-3 and longer than the front grating sections 715-1 to 715-3. The back and front grating sections thus act like DBR mirrors (i.e., back and exit mirrors) to form individual lasing cavities within each of the lasing sections 710-1 to 710-3. In other words, the longer back grating sections 714-1 to 714-3 provide sufficient reflectivity to act as back mirrors and the shorter front grating sections 715-1 to 715-3 provide sufficient reflectivity to act as exit mirrors that cause lasing while also allowing the laser light to exit. Because the back grating sections provide sufficient reflectivity, the back facet 704 is not required to be coated with an HR coating. In this embodiment, both the back facet 704 and the front facet 706 may be coated with AR coatings.

In one example, the back grating sections 714-1 to 714-3 have a length of about 150 μm, the front grating sections 715-1 to 715-3 have a length of about 50 μm, and the gratingless sections 716-1 to 716-3 have a length of about 100 μm. Where each grating is about 0.2 μm, for example, the back grating section may have 750 gratings and the front grating section may have 250 gratings. Other dimensions and configurations are also possible and within the scope of the present disclosure.

As illustrated by the wavelength spectrum 750 in FIG. 7A, highest reflectivity occurs at the Bragg wavelength at the peak but lasing may occur at one or both of the degenerate lasing modes indicated by dashed lines 754 unless the degenerate modes are suppressed by introducing the λ/4 phase shift. In this embodiment, the gratingless sections 716-1 to 716-3 may provide an approximate λ/4 phase shift that suppresses the degenerate laser modes 754 and locks on to a single lasing wavelength indicated by arrow 752, which may be at or slightly off of the peak Bragg wavelength. Although the lasing wavelength 752 may not be exactly at the peak Bragg wavelength, the gratingless sections 716-1 to 716-3 provide a sufficient phase shift to suppress mode degeneracy resulting in single-mode operation. As discussed above, the Bragg wavelength (and thus the lasing wavelength 752) for each of the laser sections 710-1 to 710-3 changes with temperature changes.

Operation of the embodiments of the multiple section tunable lasers 600, 700 is illustrated in greater detail in FIGS. 8A and 8B. Similar to the operation described above in connection with FIGS. 5A and 5B, a channel wavelength may be selected by driving the appropriate laser section and setting the appropriate temperature for thermal tuning. As shown in FIG. 8A, for example, channel wavelength $\lambda_2$ may be selected by driving the corresponding laser section having a wavelength range (e.g., $\lambda_1$-$\lambda_5$) including that channel wavelength $\lambda_2$, for example, by applying the higher driving current ($I_{OPH}$). The lower driving current ($I_{OPL}$) may be applied to the other laser sections and/or any laser sections between the active laser section and the back facet may be turned off. In one example, the higher driving current ($I_{OPH}$) may be about 40 mA and the lower driving current ($I_{OPL}$) may be about 6 mA. As the corresponding laser section is driven, the temperature is set such that the corresponding laser section is thermally tuned to the selected channel wavelength $\lambda_2$ within the wavelength range.

As shown in FIG. 8B, a different channel wavelength $\lambda_8$ may be selected by driving the corresponding laser section having a wavelength range (e.g., $\lambda_6$-$\lambda_{10}$) including that channel wavelength $\lambda_8$ and then setting the temperature to thermally tune to that wavelength $\lambda_8$. As illustrated, lasing may occur in these embodiments at the selected wavelengths exclusively within the individual lasing cavities formed in the lasing sections by the front and back grating sections as described above. Thus, the lasing cavities do not extend to the back and front facets of these multiple section tunable lasers.

In other embodiments, additional phase shift sections may be provided between each of the laser sections, for example, between the first and second laser sections 610-1, 610-2 and the second and third laser sections 610-2, 610-3 in the multiple section tunable laser 600. The reflections of the gratings from non-active laser sections (e.g., second and third laser sections in FIG. 8A) may feedback to the active laser section (e.g., the first laser section in FIG. 8A), causing issues with mode stability. Providing an additional phase shift between the laser sections (i.e., in addition to phase shift sections within the laser sections) may thus improve performance of the laser. The amount of phase shift provided by these additional phase shift sections may depend on other design parameters such as the length of the lasing sections.

Figure 9:
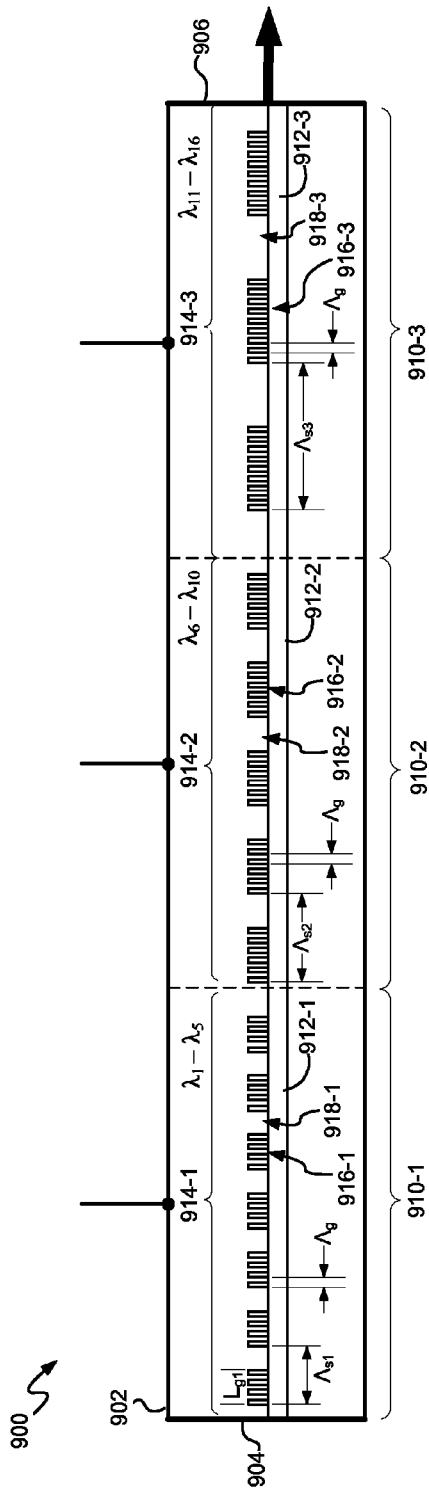
FIG. 9 is a schematic diagram of a multiple-section tunable laser with sampled gratings, consistent with another embodiment of the present disclosure.

An electron beam writing technique may be used to produce the complex gratings in the multiple section tunable lasers 600, 700, but this fabrication process may be slow and expensive. Referring to FIG. 9, a further embodiment of a multiple section tunable laser 900 may include sampled grating sections 914-1 to 914-3 in respective in-line laser sections 910-1 to 910-3 formed in a semiconductor laser body 902. The sampled grating sections 914-1 to 914-3 have the same grating period ($\Lambda_g$) through the laser sections 910-1 to 910-3 but different sampling periods ($\Lambda_{s1}$, $\Lambda_{s2}$, $\Lambda_{s3}$). Because the same grating period may be used, the fabrication process may be simplified as described in greater detail below.

In the multiple section tunable laser 900, the in-line laser sections 910-1 to 910-3 are formed along semiconductor active regions 912-1 to 912-3 in the semiconductor laser body 902. The semiconductor active regions 912-1 to 912-3 may include a multiple quantum-well active region or other gain media capable of emitting a spectrum of light across a range of wavelengths and capable of amplifying light reflected back into the gain media. The sampled grating sections 914-1 to 914-3 have grating structures and parameters (e.g., grating period, sampling period, index of refraction, and length) that generate light within the respective wavelength ranges when a driving current is applied to the respective laser section. The multiple section tunable laser 900 also includes a back facet 904 and a front facet 906 for emitting laser light generated in the respective one of the laser sections 910-1 to 910-3. Similar to the embodiments describe above, the back facet 404 may have an AR coating or an HR coating and the front facet 906 may have an AR coating.

The sampled grating sections 914-1 to 914-3 each include periodic grating structures 916-1 to 916-3 separated by blank spaces 918-1 to 918-3 providing a different sampling period ($\Lambda_{s1}$, $\Lambda_{s2}$, $\Lambda_{s3}$) in each of the sampled grating sections 914-1 to 914-3. Each of the sampled grating sections 914-1 to 914-3 may also have a different duty cycle. The duty cycle is the ratio of the length of a grating structure in one sampling period to the sampling period (e.g., $L_{g1}/\Lambda_{s1}$). An example of these parameters may be a grating period $\Lambda_g$ of 240 nm, sampling periods $\Lambda_{s1}$, $\Lambda_{s2}$, and $\Lambda_{s3}$ of 6.1, 6.7 and 5.3 μm respectively, and a duty cycle of 50%.

In the illustrated example, the first sampled grating section 914-1 in the first laser section 910-1 is configured to reflect light at a Bragg wavelength in a wavelength range of $\lambda_1$-$\lambda_5$, the second sampled grating section 914-2 in the second laser section 910-2 is configured to reflect light at a Bragg wavelength in a wavelength range of $\lambda_6$-$\lambda_{10}$, and the third sampled grating section 914-3 in the third laser section 910-3 is configured to reflect light at a Bragg wavelength in a wavelength range of $\lambda_{11}$-$\lambda_{16}$. The laser sections 910-1 to 910-3 may be thermally tunable to change the reflected Bragg wavelength within the respective wavelength ranges and select the lasing wavelength. This embodiment of the multiple section tunable laser 900 may thus be operated in the same manner as the embodiments described above.

Although the illustrated embodiment shows a multiple section tunable laser 900 with three laser sections 910-1 to 910-3, the multiple section tunable laser 900 may have other numbers of laser sections 910-1 to 910-3. The in-line laser sections 910-1 to 910-3 also are not required to be contiguous as shown. The multiple section tunable laser 900 may also include other sections (e.g., between the laser sections or at the ends of the laser), such as other gain sections that provide gain for amplifying the light generated in the laser sections.

Figure 10A:
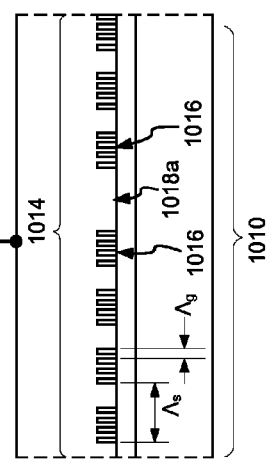
FIGS. 10A and 10B are schematic diagrams of laser sections with sampled gratings providing a phase shift, consistent with further embodiments of the present disclosure.
Figure 10B:
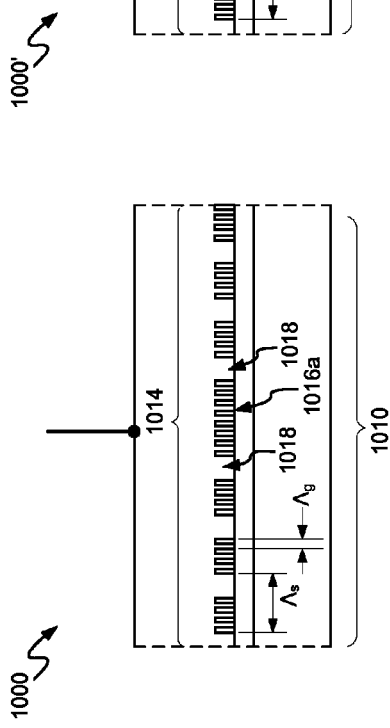

As shown in FIGS. 10A and 10B, embodiments of a multiple section tunable laser 1000, 1000' with sampled gratings may also provide a phase shift of the laser light to suppress mode degeneracy and provide a single mode operation at a selected wavelength. As described above, the phase shift may be a π/2 optical phase shift of the laser light at the Bragg wavelength ($\lambda_B$) of the sampled grating section, also referred to as a λ/4 phase shift. The λ/4 phase shift may be achieved in a sampled grating section, for example, by shifting the sampling period in the sampled grating section. As shown in FIG. 10A, one embodiment of the multiple section tunable laser 1000 may provide the λ/4 phase shift by extending at least one grating structure 1016a in a sampled grating section 1014 of a laser section 1010 by half the sampling period. The sampling period may be the same before and after the extended grating structure 1016a within the sampled grating section 1014. As shown in FIG. 10B, another embodiment of the multiple section tunable laser 1000' may provide the λ/4 phase shift by extending at least one blank space 1018a between grating structures 1016 in a sampled grating section 1014 of a laser section 1010 by half the sampling period. The sampling period may be the same before and after the extended blank space 1018*a* within the sampled grating section 1014.

The multiple section tunable lasers 900, 1000, 1000' with sampled gratings may be fabricated using a simpler process than electron beam writing. A continuous base grating with the grating period may be formed in at least one semiconductor layer of the semiconductor laser body by transferring a base grating pattern with the grating period. A plurality of sampled grating sections may then be formed on the base grating in the at least one semiconductor layer by transferring a sampled grating pattern with the sampling period. Holographic photolithography may be used, for example, to form the base grating pattern and the sampled grating pattern in a photosensitive or photoresist material. Holographic photolithography may include exposures of UV light or other radiation capable of altering the photoresist material where exposed to form the patterns, for example, using photolithography techniques known for use in fabricating Bragg or diffraction gratings in semiconductor lasers. In other embodiments, the base grating and sampled grating sections may be formed by holographic exposures, for example, using phase masks known for use in fabricating Bragg or diffraction gratings in semiconductor lasers.

Referring to FIGS. 11A-11C, one example of a method of fabricating a multiple section tunable laser including sampled gratings is described in greater detail. As shown in FIG. 11A, a semiconductor laser body 1102 includes a plurality of semiconductor layers 1104, 1106, 1108 forming an active region 1112, for example, consistent with known DFB or DBR semiconductor diode lasers. The sampled grating sections may be formed in at least one semiconductor layer 1108 extending along or parallel to the active region 1112.

As shown in FIG. 11A, a first exposure of radiation 1120 forms a base grating pattern with the grating period ($\Lambda_g$) in a photoresist material 1122. The first exposure of radiation 1120 may be a holographic exposure forming an interference pattern corresponding to the base grating pattern using known holographic photolithography techniques. The base grating pattern in the photoresist material 1122 is then transferred to the semiconductor layer 1108 to form the continuous base grating 1116 with the grating period ($\Lambda_g$) parallel to the active region 1112, as shown in FIG. 11B. The base grating pattern may be transferred using known photolithography techniques such as by developing the photoresist material 1122 and etching the semiconductor layer 1108 with the base grating pattern.

As shown in FIG. 11B, a second exposure of radiation 1130 forms a sampled grating pattern in a photoresist material 1132 with different sampling periods ($\Lambda_{s1}$, $\Lambda_{s2}$, $\Lambda_{s3}$) in different sections corresponding to different laser sections 1010-1 to 1010-3. The second exposure of radiation 1130 may also be a holographic exposure forming an interference pattern corresponding to the sampled grating pattern using known holographic photolithography techniques. In other embodiments, the exposures may be made using masks, such as phase masks, to form the grating patterns in the photoresist material.

The sampled grating pattern in the photoresist material 1132 is then transferred to the semiconductor layer 1108 and superimposed on the continuous base grating 1116 to form the sampled grating sections 1114-1 to 1114-3, as shown in FIG. 11C. The sampled grating pattern may be transferred using known photolithography techniques such as by developing the photoresist material 1132 and etching the semiconductor lawyer 1108 to form the sampled grating pattern on the continuous base grating 1116. Transferring the sampled grating pattern erases the base grating 1116 periodically to form blank spaces 1118 between segments of the base grating 1116 with the sampling periods ($\Lambda_{s1}$, $\Lambda_{s2}$, $\Lambda_{s3}$) in the respective sampled grating sections 1114-1 to 1114-3. Thus, the sampled grating sections 1114-1 to 1114-3 may be formed using two photolithography steps, which is simpler and less expensive than electron beam writing.

Although the example uses only two photolithography steps, other variations of the method may use additional steps. The method may also use different techniques for forming the base grating and for forming the sampled grating sections. The method may further include additional steps such as coating the facets of the semiconductor laser body (e.g., with AR coatings) and providing electrical connections to each of the laser sections (e.g., by wirebonding).

Accordingly, multiple section tunable lasers with in-line laser sections with sampled gratings, consistent with embodiments described herein, may provide relatively inexpensive lasers capable of being tuned within a relative wide range for WDM applications and may be fabricated using a relatively simple process.

Consistent with an embodiment, a tunable laser includes a semiconductor laser body extending between a front facet and a back facet. The laser body includes a plurality of in-line laser sections each configured to be driven independently to generate laser light at a wavelength within a different respective wavelength range. The laser light generated from each selected one of the laser sections is emitted from the front facet. Each of the in-line laser sections includes a semiconductor active region for amplifying, by stimulated emission, light at a wavelength in the respective wavelength range, and a sampled grating section along the active region. The sampled grating section is configured to produce the wavelength in the respective wavelength range. The sampled grating sections in the in-line laser sections have the same grating period, and the sampled grating sections in the in-line laser sections, respectively, have different sampling periods.

Consistent with another embodiment, an optical networking unit includes a photodetector for receiving an optical signal at a received channel wavelength and a tunable laser for transmitting an optical signal at a transmitted channel wavelength. The received channel wavelength is in one of the L-band or the C-band, and the transmitted channel wavelength is in the other of the L-band or the C-band. The tunable laser includes a semiconductor laser body extending between a front facet and a back facet. The laser body includes a plurality of in-line laser sections each configured to be driven independently to generate laser light at a wavelength within a different respective wavelength range. The laser light generated from each selected one of the laser sections is emitted from the front facet. Each of the in-line laser sections includes a semiconductor active region for amplifying, by stimulated emission, light at a wavelength in the respective wavelength range, and a sampled grating section along the active region. The sampled grating section is configured to produce the wavelength in the respective wavelength range. The sampled grating sections in the in-line laser sections have the same grating period, and the sampled grating sections in the in-line laser sections, respectively, have different sampling periods.

Consistent with a further embodiment, a wavelength division multiplexed (WDM) system includes a plurality of terminals associated with different respective channel wavelengths and configured to transmit optical signals on the different respective channel wavelengths. At least one of the plurality of terminals includes at least a tunable laser configured to be tuned to a respective one of the channel wavelengths. The tunable laser includes a semiconductor laser body extending between a front facet and a back facet. The laser body includes a plurality of in-line laser sections each configured to be driven independently to generate laser light at a wavelength within a different respective wavelength range. The laser light generated from each selected one of the laser sections is emitted from the front facet. Each of the in-line laser sections includes a semiconductor active region for amplifying, by stimulated emission, light at a wavelength in the respective wavelength range, and a sampled grating section along the active region. The sampled grating section is configured to produce the wavelength in the respective wavelength range. The sampled grating sections in the in-line laser sections have the same grating period, and the sampled grating sections in the in-line laser sections, respectively, have different sampling periods.

Consistent with yet another embodiment, a method is provided for producing a multiple section in-line tunable laser. The method includes: providing a semiconductor laser body including a plurality of semiconductor layers, a front facet, and a back facet, wherein the semiconductor layers form a semiconductor active region; forming a continuous base grating in at least one of the semiconductor layers parallel to the active region, the base grating having a grating period; and forming a plurality of sampled grating sections in the base grating, wherein the sampled grating sections have different respective sampling periods to form multiple in-line laser sections configured to generate laser light at different wavelengths.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A tunable laser comprising:
a semiconductor laser body extending between a front facet and a back facet, the laser body including a plurality of in-line laser sections each configured to be driven independently to generate laser light at a wavelength within a different respective wavelength range, wherein the laser light generated from each selected one of the laser sections is emitted from the front facet, wherein the laser light generated by at least one in-line laser section passes through another in-line laser section, and wherein each of the in-line laser sections comprises:
a semiconductor active region for amplifying, by stimulated emission, light at a wavelength in the respective wavelength range; and
a sampled grating section parallel to the active region, the sampled grating section being configured to produce the wavelength in the respective wavelength range; and
wherein each sampled grating section has a grating period, the grating period of each grating section being the same between all of the independently driven in-line laser sections, and, wherein, each of the sampled grating sections in the in-line laser sections have a sampling period, the sampling period being different between in-line laser sections and constant within a respective in-line laser section.

2. The tunable laser of claim 1, wherein the sampled grating section in each of the laser sections provides a phase shift of the laser light between a front and a back of the sampled grating section, and wherein the phase shift is configured to provide single mode operation at the selected wavelength.

3. The tunable laser of claim 2, wherein the phase shift provides a $\lambda/4$ phase shift of the laser light.

4. The tunable laser of claim 3, wherein each of the laser sections has a different length.

5. The tunable laser of claim 3, further including additional phase shift sections between each of the laser sections.

6. The tunable laser of claim 1, wherein the plurality of in-line laser sections include three laser sections.

7. The tunable laser of claim 1, wherein each said different respective wavelength range includes at least five channel wavelengths.

8. The tunable laser of claim 1, wherein each of the plurality of in-line laser sections is tunable in response to temperature changes to generate a selected wavelength within the respective wavelength range.

9. The tunable laser of claim 8, wherein each said different respective wavelength range includes at least five channel wavelengths, and wherein each of the laser sections is tunable to one of the at least five channel wavelengths using the same temperature range.

10. The tunable laser of claim 1, wherein each said different respective wavelength range includes channel wavelengths in the C-band.

11. The tunable laser of claim 1, wherein the front facet and the back facet include anti-reflective (AR) coatings.

12. An optical networking unit comprising:
a photodetector for receiving an optical signal at a received channel wavelength, wherein the received channel wavelength is in one of the L-band or the C-band; and
a tunable laser for transmitting an optical signal at a transmitted channel wavelength, wherein the transmitted channel wavelength is in the other of the L-band or the C-band, the tunable laser comprising a semiconductor laser body extending between a front facet and a back facet, the laser body including a plurality of in-line laser sections each configured to be driven independently to generate laser light at a wavelength within a different respective wavelength range, wherein the laser light generated from each selected one of the laser sections is emitted from the front facet, wherein the laser light generated by at least one in-line laser section passes through another in-line laser section, and wherein each of the in-line laser sections comprises:
a semiconductor active region for amplifying, by stimulated emission, light at a wavelength in the respective wavelength range; and
a sampled grating section parallel to the active region, the sampled grating section being configured to produce the wavelength in the respective wavelength range; and
wherein each sampled grating section has a grating period, the grating period of each grating section being the same between all of the independently driven in-line laser sections, and, wherein, each of the sampled grating sections in the-in-line laser sections have a sampling period, the sampling period being different between in-line laser sections and constant within a respective in-line laser section.

13. The optical networking unit of claim 12, wherein the sampled grating section in each of the laser sections provides a phase shift of the laser light-between a front and a back of the grating section, and wherein the phase shift is configured to provide single mode operation at the selected wavelength.

14. The optical networking unit of claim 12, wherein the wavelength of the light generated by each of the laser sections is tunable to the transmitted channel wavelength within the respective wavelength range in response to temperature changes.

15. A wavelength division multiplexed (WDM) system comprising:
 a plurality of terminals associated with different respective channel wavelengths and configured to transmit optical signals on the different respective channel wavelengths, at least one of the plurality of terminals including at least a tunable laser configured to be tuned to a respective one of the channel wavelengths, the tunable laser comprising:
  a semiconductor laser body extending between a front facet and a back facet, the laser body including a plurality of in-line laser sections each configured to be driven independently to generate laser light at a wavelength within a different respective wavelength range, wherein the laser light generated from each selected one of the laser sections is emitted from the front facet, wherein the laser light generated by at least one in-line laser section passes through another in-line laser section, and wherein each of the in-line laser sections comprises:
   a semiconductor active region for amplifying, by stimulated emission, light at a wavelength in the respective wavelength range; and
   a sampled grating section parallel to the active region, the sampled grating section being configured to produce the wavelength in the respective wavelength range; and
  wherein each sampled grating section has a grating period, the grating period of each grating section being the same between all of the independently driven in-line laser sections, and, wherein, each of the sampled grating sections in the in-line laser sections have a sampling period, the sampling period being different between in-line laser sections and constant within a respective in-line laser section.

16. The WDM system of claim 15, wherein the sampled grating section in each of the laser sections provides a phase shift of the laser light between a front and a back of the grating section, and wherein the phase shift is configured to provide single mode operation at the selected wavelength.

17. The WDM system of claim 15, wherein the wavelength of the light generated by each of the laser sections is tunable to the transmitted channel wavelength within the respective wavelength range in response to temperature changes.

18. The WDM system of claim 17 wherein the plurality of terminals include optical networking terminals (ONTs) in a WDM passive optical network (PON).

19. The WDM system of claim 18 further comprising:
 at least one optical line terminal (OLT) configured to receive aggregate WDM optical signals including the channel wavelengths;
 at least one branching point coupled between the OLT and the plurality of ONTs, the branching point being configured to combine the optical signals at the channel wavelengths; and
 a trunk optical path coupling the OLT and the branching point.

20. The tunable laser of claim 2 wherein each of the in-line laser sections includes a gratingless section within the sampled grating section to provide the phase shift.

21. The optical networking unit of claim 13 wherein each of the in-line laser sections includes a gratingless section within the sampled grating section to provide the phase shift.

22. The WDM system of claim 16 wherein each of the in-line laser sections includes a gratingless section within the sampled grating section to provide the phase shift.

* * * * *